(12) United States Patent
Kim

(10) Patent No.: US 11,404,000 B2
(45) Date of Patent: Aug. 2, 2022

(54) DISPLAY DEVICE CAPABLE OF DETERMINING A BONDING STATE OF A DRIVER INTEGRATED CIRCUIT THEREIN

(71) Applicant: SAMSUNG DISPLAY CO., LTD., Yongin-si (KR)

(72) Inventor: Youngbin Kim, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 1 day.

(21) Appl. No.: 16/877,671

(22) Filed: May 19, 2020

(65) Prior Publication Data
US 2021/0005135 A1    Jan. 7, 2021

(30) Foreign Application Priority Data

Jul. 5, 2019   (KR) .................. 10-2019-0081321

(51) Int. Cl.
*G09G 3/3225* (2016.01)
*H01L 27/32* (2006.01)
(Continued)

(52) U.S. Cl.
CPC ......... *G09G 3/3225* (2013.01); *G09G 3/3275* (2013.01); *H01L 27/323* (2013.01); *H01L 27/3276* (2013.01); *H01L 51/5281* (2013.01); *G01R 31/70* (2020.01); *G09G 3/006* (2013.01); *G09G 2300/0426* (2013.01);
(Continued)

(58) Field of Classification Search
CPC ......... G09G 3/3225; G09G 2310/0297; G09G 2330/08; G09G 2300/0426; G09G 2330/12; G09G 3/3275; H01L 51/5281; H01L 27/3276; H01L 27/323; H01L 27/3262
See application file for complete search history.

(56) References Cited

U.S. PATENT DOCUMENTS 8,957,696 B2    2/2015  Von Standt et al.
9,013,197 B2 *  4/2015  Lee .................. G01R 31/70
                                                  324/345
(Continued)

FOREIGN PATENT DOCUMENTS

KR    10-1151982    5/2012
KR    10-1587428    1/2016
(Continued)

*Primary Examiner* — Patrick N Edouard
*Assistant Examiner* — Douglas M Wilson
(74) *Attorney, Agent, or Firm* — F. Chau & Associates, LLC

(57) ABSTRACT

A display device includes a first substrate including a display area and a non-display area, pixels disposed in the display area, a driver integrated circuit located in the non-display area and connected to the pixels through data lines, a first pad portion disposed in the non-display area, a second pad portion disposed in the non-display area and connected to the driver integrated circuit, a first thin film transistor connected to one of the data lines and adjusting a first data signal, a second thin film transistor connected to another of the data lines and adjusting the first data signal, a first wiring connecting the first thin film transistor and the first pad portion, a second wiring connecting the second thin film transistor and the second pad portion, and a gate signal line connected to the first and second thin film transistors.

19 Claims, 8 Drawing Sheets

(51) Int. Cl.
*G09G 3/3275* (2016.01)
*G09G 3/00* (2006.01)
*G01R 31/70* (2020.01)
*H01L 51/52* (2006.01)

(52) U.S. Cl.
CPC . *G09G 2310/0297* (2013.01); *G09G 2330/12* (2013.01); *H01L 27/3262* (2013.01)

(56) References Cited

U.S. PATENT DOCUMENTS

| | | | |
|---|---|---|---|
| 9,460,646 B2* | 10/2016 | Hwang | G09G 3/006 |
| 9,772,514 B2* | 9/2017 | Moon | G02F 1/0121 |
| 10,699,623 B2* | 6/2020 | Jia | G09G 3/006 |
| 2005/0127936 A1* | 6/2005 | Chen | G01R 27/205 |
| | | | 324/760.01 |
| 2011/0018571 A1* | 1/2011 | Kim | G02F 1/1345 |
| | | | 324/760.02 |
| 2016/0086563 A1* | 3/2016 | Park | G09G 3/3685 |
| | | | 345/211 |
| 2016/0247436 A1* | 8/2016 | Lee | G09G 3/006 |
| 2016/0260367 A1* | 9/2016 | Kwak | G09G 3/3291 |
| 2017/0083133 A1* | 3/2017 | Kang | G02F 1/1309 |
| 2021/0225221 A1* | 7/2021 | Zhang | G02F 1/136286 |

FOREIGN PATENT DOCUMENTS

| | | |
|---|---|---|
| KR | 10-1791192 | 10/2017 |
| KR | 10-1971066 | 4/2019 |

* cited by examiner

DISPLAY DEVICE CAPABLE OF DETERMINING A BONDING STATE OF A DRIVER INTEGRATED CIRCUIT THEREIN

CROSS-REFERENCE TO RELATED APPLICATION

This application claims priority under 35 U.S.C. § 119 to Korean Patent Application No. 10-2019-0081321, filed on Jul. 5, 2019 in the Korean Intellectual Property Office (KIPO), the disclosure of which is incorporated by reference herein in its entirety.

TECHNICAL FIELD

Exemplary embodiments of the inventive concept relate to a display device, and more particularly, to a display device capable of determining a bonding state of a driver integrated circuit (IC) therein during a chip on glass (COG) or chip on panel (COP) process for the display device.

DISCUSSION OF RELATED ART

In general, display devices include a display panel and a display driving device. The display driving device is manufactured in the form of a chip and is mounted in a non-display area of the display panel.

The mounting methods are, for example, a chip on glass (COG) method, a chip on panel (COP) method, a tape carrier package (TCP) method, or a chip on film (COF) method. A dual COG/COP method is widely used because of its relatively simple structure, as compared to the TCP method and the COF method.

When the display driving device is mounted in the COG method, the display driving device is mounted through bonding to pads that are located in the non-display area of the display panel. A bonding resistance is caused, which affects the output of the display driving device. Hence, it is better to have a small bonding resistance.

However, when the display driving device is mounted in the non-display area of the display panel through a bonding process, the bonding resistance may increase due to a change in the process environment. In such a case, the increased bonding resistance may affect the output of the display driving device, and defects may occur.

In general, a crimp bonding resistance is mechanically measured to ensure that crimp bonding performs well in the COG/COP process. However, crimp bonding resistance cannot be measured during an inspection process for completed products (final testing (FT), outgoing quality control (OQC), inspection after aging) at which time the display panel has been already assembled. It may also be inspected manually, but it takes a long time, and if the outer appearance of the product is damaged, it cannot be shipped as a good product.

SUMMARY

According to an exemplary embodiment of the inventive concept, a display device includes a first substrate including a display area and a non-display area, a plurality of pixels disposed in the display area, a driver integrated circuit located in the non-display area and electrically connected to the plurality of pixels through a plurality of data lines, a first pad portion disposed in the non-display area and electrically connected to a printed circuit board, a second pad portion disposed in the non-display area and electrically connected to the driver integrated circuit, a first thin film transistor connected to one of the plurality of data lines and configured to adjust a first data signal applied from the driver integrated circuit, a second thin film transistor connected to another of the plurality of data lines and configured to adjust the first data signal applied from the driver integrated circuit, a first wiring located in the non-display area and connecting the first thin film transistor and the first pad portion to each other, a second wiring located in the non-display area and connecting the second thin film transistor and the second pad portion to each other, and a gate signal line connected to gate terminals of the first thin film transistor and the second thin film transistor.

In an exemplary embodiment of the inventive concept, the first thin film transistor and the second thin film transistor may be alternately disposed.

In an exemplary embodiment of the inventive concept, the first wiring may include a matching resistor.

In an exemplary embodiment of the inventive concept, the matching resistor may have a resistance value that is substantially equal to a resistance value of the second pad portion.

In an exemplary embodiment of the inventive concept, the display device may further include an adhesive portion interposed between the first pad portion and the driver integrated circuit.

In an exemplary embodiment of the inventive concept, the adhesive portion may include an adhesive layer, and at least one conductive particle dispersed in the adhesive layer.

In an exemplary embodiment of the inventive concept, the display device may further include a driving unit configured to output a signal to the driver integrated circuit, the first wiring, and the gate signal line.

In an exemplary embodiment of the inventive concept, the driving unit may include a driver chip including a first port, a second port, a third port connected to the first wiring, and a fourth port connected to the gate signal line.

In an exemplary embodiment of the inventive concept, the display device may further include a first line disposed on the first substrate and configured to transmit the first data signal output from the driver chip to the driver integrated circuit, and a second line disposed on the first substrate and configured to apply a second data signal output from the driver chip to the second pad portion.

In an exemplary embodiment of the inventive concept, the driver integrated circuit may include a switching unit configured to switch the first data signal and transmit the first data signal to the first thin film transistor and the second thin film transistor through one of the plurality of data lines.

In an exemplary embodiment of the inventive concept, the driver integrated circuit may include a main body overlapping the second pad portion in a pad area of the first substrate, and one or more bumps protruding from the main body at predetermined intervals.

In an exemplary embodiment of the inventive concept, the second pad portion may include one or more pad terminals that connect end portions of two adjacent bumps of the one or more bumps.

In an exemplary embodiment of the inventive concept, the second pad portion may output a second data signal to the second thin film transistor through the second wiring via the one or more bumps.

In an exemplary embodiment of the inventive concept, the second pad portion may be disposed at one of opposite ends of the driver integrated circuit or at each of the opposite ends of the driver integrated circuit.

In an exemplary embodiment of the inventive concept, the first thin film transistor may receive the first data signal from the driver integrated circuit, receives a second data signal from the first wiring, and output a difference signal to one or more of the plurality of pixels.

In an exemplary embodiment of the inventive concept, the second thin film transistor may receive the first data signal from the driver integrated circuit, receive a second data signal from the second pad portion, and output a difference signal to the one or more of the plurality of pixels.

According to an exemplary embodiment of the inventive concept, a display device includes a first substrate including a display area and a non-display area, a plurality of pixels disposed in the display area, a driver integrated circuit located in the non-display area and electrically connected to the plurality of pixels through a plurality of data lines, a first pad portion disposed in the non-display area, a second pad portion disposed in the non-display area and electrically connected to the driver integrated circuit, a first thin film transistor connected to one of the plurality of data lines and configured to adjust a first data signal applied from the driver integrated circuit, a second thin film transistor connected to another of the plurality of data lines and configured to adjust the first data signal applied from the driver integrated circuit, a first wiring located in the non-display area and connecting the first thin film transistor and the first pad portion to each other, a second wiring located in the non-display area and connecting the second thin film transistor and the second pad portion to each other, a gate signal line connected to gate terminals of the first thin film transistor and the second thin film transistor, a flexible printed circuit board electrically connected to the first pad portion, and a printed circuit board electrically connected to a connection portion.

In an exemplary embodiment of the inventive concept, the printed circuit board may include a driving unit configured to output a signal to the driver integrated circuit, the first wiring, and the gate signal line.

In an exemplary embodiment of the inventive concept, the driving unit may include a driver chip configured to output the first data signal and the second data signal to the first pad portion.

In an exemplary embodiment of the inventive concept, the driver chip may output a gate driving signal to the first pad portion.

According to an exemplary embodiment of the inventive concept, a display device, includes a plurality of pixels including a plurality of first pixels and a plurality of second pixels alternately disposed in a first direction, a plurality of first transistors and a plurality of second transistors alternately disposed in the first direction, where the plurality of first transistors are connected to the plurality of first pixels and the plurality of second transistors are connected to the plurality of second transistors, a first pad portion connected to a printed circuit board, a second pad portion connected to a driver integrated circuit, a first wiring including a matching resistor and connecting the plurality of first transistors to the first pad portion, and a second wiring connecting the plurality of second transistors to the second pad portion. The matching resistor has a resistance value that is substantially the same as a resistance value of the second pad portion.

BRIEF DESCRIPTION OF THE DRAWINGS

The above and other features of the inventive concept will become more apparent by describing in detail exemplary embodiments thereof with reference to the accompanying drawings.

DETAILED DESCRIPTION OF THE EMBODIMENTS

Figure 1:
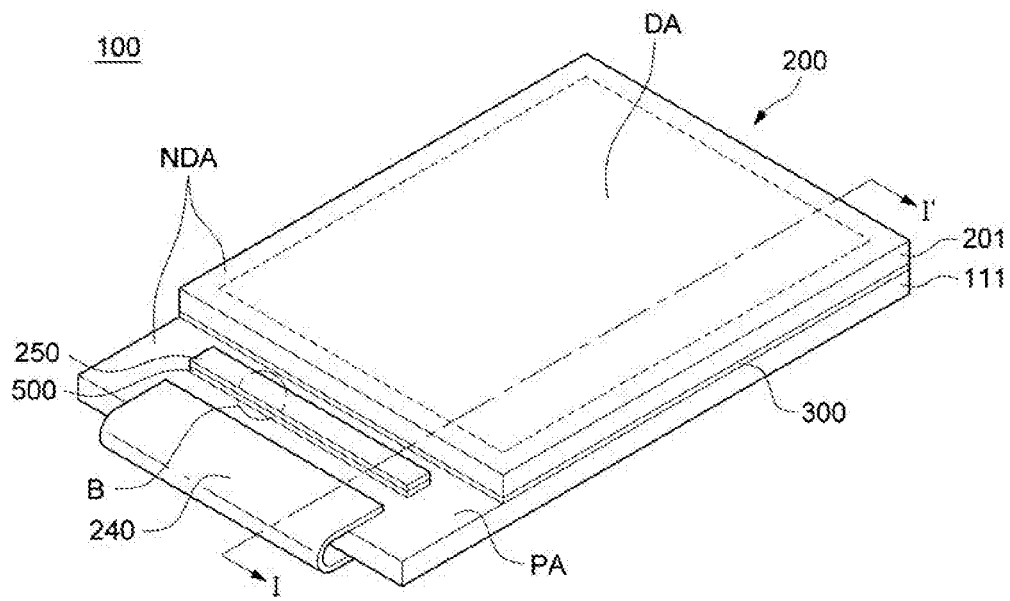
FIG. 1 is a perspective view illustrating a display device according to an exemplary embodiment of the inventive concept.

Exemplary embodiments of the inventive concept are directed to a display device capable of determining whether a driver integrated circuit (IC) is attached well onto a substrate during a chip on glass (COG) or chip on panel (COP) process of a manufacturing process of the display device based on a pixel brightness difference of a display panel of the display device.

Exemplary embodiments will now be described more fully hereinafter with reference to the accompanying drawings. Like reference numerals may refer to like elements throughout this application.

In the drawings, thicknesses of layers and areas may be illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

Spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in the case where a device illustrated in the drawing is turned over, the device located "below" or "beneath" another device may be placed "above" the other device. Accordingly, the illustrative term "below" may include both the lower and upper positions. The device may also be oriented in the other direction and thus the spatially relative terms may be interpreted differently depending on the orientation.

Throughout the specification, when an element is referred to as being "connected" to another element, the element is "directly connected" to the other element, or "electrically connected" to the other element with one or more intervening elements interposed therebetween.

It will be understood that, although the terms "first," "second," "third," and the like may be used herein to describe various elements, these elements should not be limited by these terms. These terms are only used to distinguish one element from another element. Accordingly, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, or 5% of the stated value.

Hereinafter, an organic light emitting diode (OLED) display device including an organic light emitting layer is described as a display device, but the inventive concept is not limited thereto. The display device according to an exemplary embodiment of the inventive concept may be, for example, a liquid crystal display (LCD) device, a plasma display panel (PDP) device, or a field emission display device.

In the accompanying drawings, an active matrix-type OLED (AMOLED) display device having a 2Tr-1Cap structure which includes two thin film transistors (TFTs), and one capacitor in each pixel is illustrated, but the inventive concept is not limited thereto. In the OLED display device, the number of TFTs, the number of capacitors, and/or the number of wirings are not limited. Herein, a pixel refers to a minimum unit for displaying an image, and the OLED display device displays an image through a plurality of pixels.

Meanwhile, the term "a substrate" refers to a first substrate according to exemplary embodiments of the inventive concept, unless stated otherwise.

Hereinafter, a display device according to exemplary embodiments of the inventive concept will be described in detail with reference to FIGS. 1 to 13.

Figure 2:
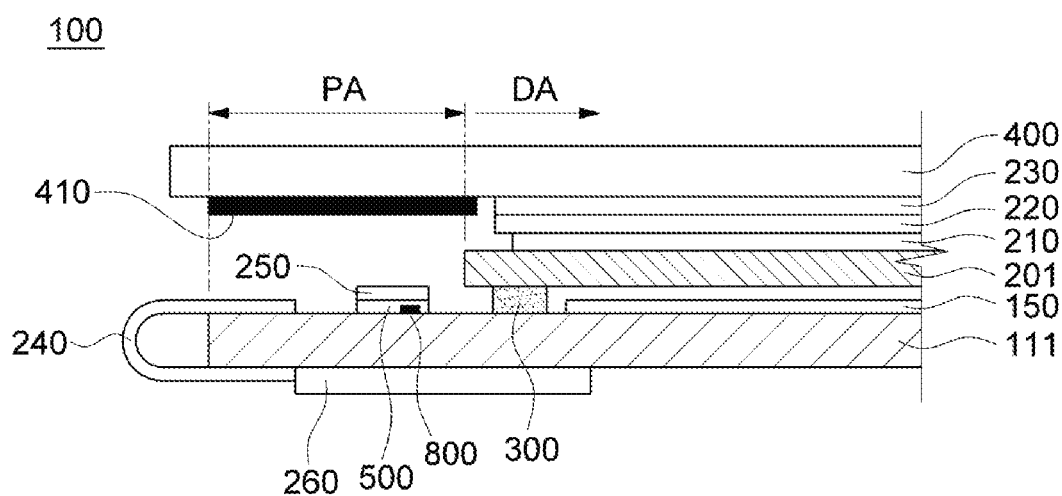
FIG. 2 is a cross-sectional view taken along line I-I' of FIG. 1 according to an exemplary embodiment of the inventive concept.

FIG. 1 is a perspective view illustrating a display device according to an exemplary embodiment of the inventive concept, and FIG. 2 is a cross-sectional view taken along line I-I' of FIG. 1 according to an exemplary embodiment of the inventive concept.

Referring to FIGS. 1 and 2, a display device 100 according to an exemplary embodiment of the inventive concept includes a first substrate 111, a display panel 200, a second substrate 201, a sealing member 300, a connection portion 240, and a driver integrated circuit (IC) 250.

In addition, the display device 100 includes, for example, a touch portion 210, a polarizing plate 220, a resin 230, a printed circuit board (PCB) 260, a window 400, a black matrix 410, an adhesive portion 500, and a second pad portion 800.

The display panel 200, which is a panel for displaying images, may be an organic light emitting diode (OLED) display panel. Alternatively, the display panel 200 may be one of a liquid crystal display (LCD) panel, an electrophoretic display panel, a light emitting diode (LED) panel, an inorganic electro-luminescent (EL) display panel, a field emission display (FED) panel, a surface conduction electron-emitter display (SED) panel, a plasma display panel (PDP), or a cathode ray tube (CRT) display panel. However, this is only one example, and all kinds of display panels that are currently developed and commercialized or that may be implemented according to future technology developments may be used as the display panel 200 according to exemplary embodiments of the inventive concept.

The display device 100 according to an exemplary embodiment of the inventive concept will be described with respect to an OLED display device to which an OLED display panel is applied by way of example, and hereinafter will be referred to as an OLED display device 100.

The display panel 200 includes a first substrate 111, a second substrate 201 disposed to face the first substrate 111, a display unit 150, a sealing member 300, the touch portion 210, and the polarizing plate 220. However, the inventive concept is not limited thereto. For example, the first substrate 111 may be encapsulated by an encapsulation film or the like, instead of the second substrate 201.

The first substrate 111 may include a display area DA for displaying images by light emission and a non-display area NDA located outside the display area DA. A plurality of pixels are formed in the display area DA of the first substrate 111 to display images. The display unit 150 is disposed at the display area DA.

The non-display area NDA includes a pad area PA at which, for example, a plurality of conductive pads are formed for receiving an external signal for light emission of the OLED and transmitting the external signal to the OLED.

The first substrate 111 may include a transparent glass material that mainly includes silicon oxide ($SiO_2$). The first substrate 111 is not necessarily limited thereto, and may include a transparent plastic material.

The driver IC 250 may be an IC chip. The driver IC 250 may be attached on the first substrate 111 through the adhesive portion 500. In other words, the adhesive portion 500 may be interposed between the first substrate 111 and the driver IC 250. The driver IC 250 may be disposed at the pad area PA of the non-display area NDA.

The display unit 150 is formed on the first substrate 111 and is electrically connected to the driver IC 250. The display unit 150 is disposed at the display area DA and includes one or more pixels. In other words, the display unit 150 includes an OLED, and, for example, a TFT and a wiring for driving the OLED. The display unit 150 will be described below with reference to FIGS. 3 and 4. In addition to the OLED, the display unit 150 may be configured with any element as long as it can constitute a display device.

The second substrate 201 is disposed to face the first substrate 111 and is laminated with the first substrate 111 with the sealing member 300 as a medium. The second substrate 201 covers and protects the display unit 150. The second substrate 201 may include a transparent synthetic resin film, such as acryl, as well as a glass substrate, and may further include a metal plate. For example, the second substrate 201 may include, for example, one of a polyethylene (PET) film, a polypropylene (PP) film, a polyamide (PA) film, a polyacetal (POM) film, a polymethyl methacrylate (PMMA) film, polybutylene terephthalate (PBT) film, a polycarbonate (PC) film, a cellulose film, or a moisture proof cellophane film.

The second substrate 201 may have an area less than an area of the first substrate 111. Accordingly, the pad area PA of the first substrate 111 may be exposed by the second substrate 201.

The sealing member 300 may include a material that is commonly used, such as sealing glass frit.

Although FIG. 1 illustrates that the sealing member 300 is disposed between the first substrate 111 and the second substrate 201, the inventive concept is not limited thereto. The sealing member 300 may not be disposed between the first substrate 111 and the second substrate 201. For example, the first substrate 111 and the second substrate 201 may be bonded by an ultrasonic bonding method. In other words, in the state where the first substrate 111 and the second substrate 201 are in contact with each other, ultrasonic vibration is applied to a contact portion to induce molecular motion at a contact surface by vibration of a tool horn. The heat generated due to the molecular motion is used to make an interface junction. Ultrasonic bonding requires no adhesives or solvents, has fast fusion rates, and causes no deformation or damage to the surface of the weldment.

The touch portion 210 is disposed on the second substrate 201 corresponding to the display area DA of the first substrate 111. The touch portion 210 includes first and second electrodes that cross each other. The first and second electrodes may be directly patterned, in an on-cell type, on the second substrate 201 into a matrix form with a plurality of rows and columns. The first and second electrodes correspond to touch sensor patterns. In addition, the touch portion 210 may be disposed on the second substrate 201 as a separately manufactured touch panel.

The window 400 includes a transparent material, such as glass or resin, and serves to protect the display panel 200 from being broken by an external impact. For example, the window 400 is disposed on the touch portion 210 and covers the display area DA and the pad area PA.

The black matrix 410 is disposed at an area of the window 400 corresponding to the pad area PA. The black matrix 410 includes a printing material that blocks the visibility of the pattern below the window 400.

The polarizing plate 220 is disposed between the window 400 and the touch portion 210. The polarizing plate 220 prevents reflection of external light.

The resin 230 is disposed between the window 400 and the touch portion 210 and serves to improve luminance, transmittance, reflectance, and visibility of the display device 100. The resin 230 prevents an air gap from being generated between the window 400 and the second substrate 201, and prevents infiltration of foreign matter such as dust.

The PCB 260 is a circuit board for applying driving signals to the display panel 200. A driver chip that generates a control signal for driving the display panel 200 and a power voltage generator that generates a power voltage may be included in the PCB 260.

The PCB 260 may be disposed on one surface of the display panel 200. For example, the PCB 260 may be disposed on a back surface of the display panel 200. Generally, the display panel 200 displays images on an upper surface of the display panel 200, and the back surface of the display panel 200 thus becomes an area that the user cannot see. Accordingly, the PCB 260 may be disposed on the back surface of the display panel 200 to maximize space efficiency and hide a configuration that does not need to be visually seen by the user. However, the above is merely given by way of example, and the PCB 260 may be disposed on a side surface of the display panel 200, and/or the PCB 260 and a flexible printed circuit board may be unitarily formed, where necessary.

The connection portion 240 is connected to the pad area PA of the display panel 200. The connection portion 240 may provide an electrical connection between the display panel 200 and the PCB 260 by being electrically connected to the display panel 200 and the PCB 260.

The connection portion 240 may be a flexible printed circuit board (FPCB). In addition, the connection portion 240 may be configured as a chip on film (COF) or tape carrier package (TCP) provided with an IC chip.

The connection portion 240 may include, in a cross-sectional structure, a base film and a wiring pattern disposed on the base film, and may further include a cover film disposed on the wiring pattern.

The base film and the cover film may include a material that is excellent in flexibility, insulation, and heat resistance, e.g., polyimide, but the inventive concept is not limited thereto.

The wiring pattern may be disposed between the base film and the cover film. The wiring pattern is for transmitting a predetermined electric signal. The wiring pattern may include a metal material, e.g., copper (Cu). Tin, silver, or nickel, for example, may be plated on the surface of the copper. The wiring pattern may be formed, for example, by casting, laminating, electroplating, or other various methods.

The second pad portion 800 may be disposed between the first substrate 111 and the driver IC 250. The second pad portion 800 is disposed in the non-display area NDA and is electrically connected to the printed circuit board 260. The second pad portion 800 outputs power which is generated according to a crimp resistance of the driver IC 250 attached onto the first substrate 111 by the adhesive portion 500.

Hereinafter, one pixel of the display unit 150 will be described with reference to FIGS. 3 and 4.

Figure 3:
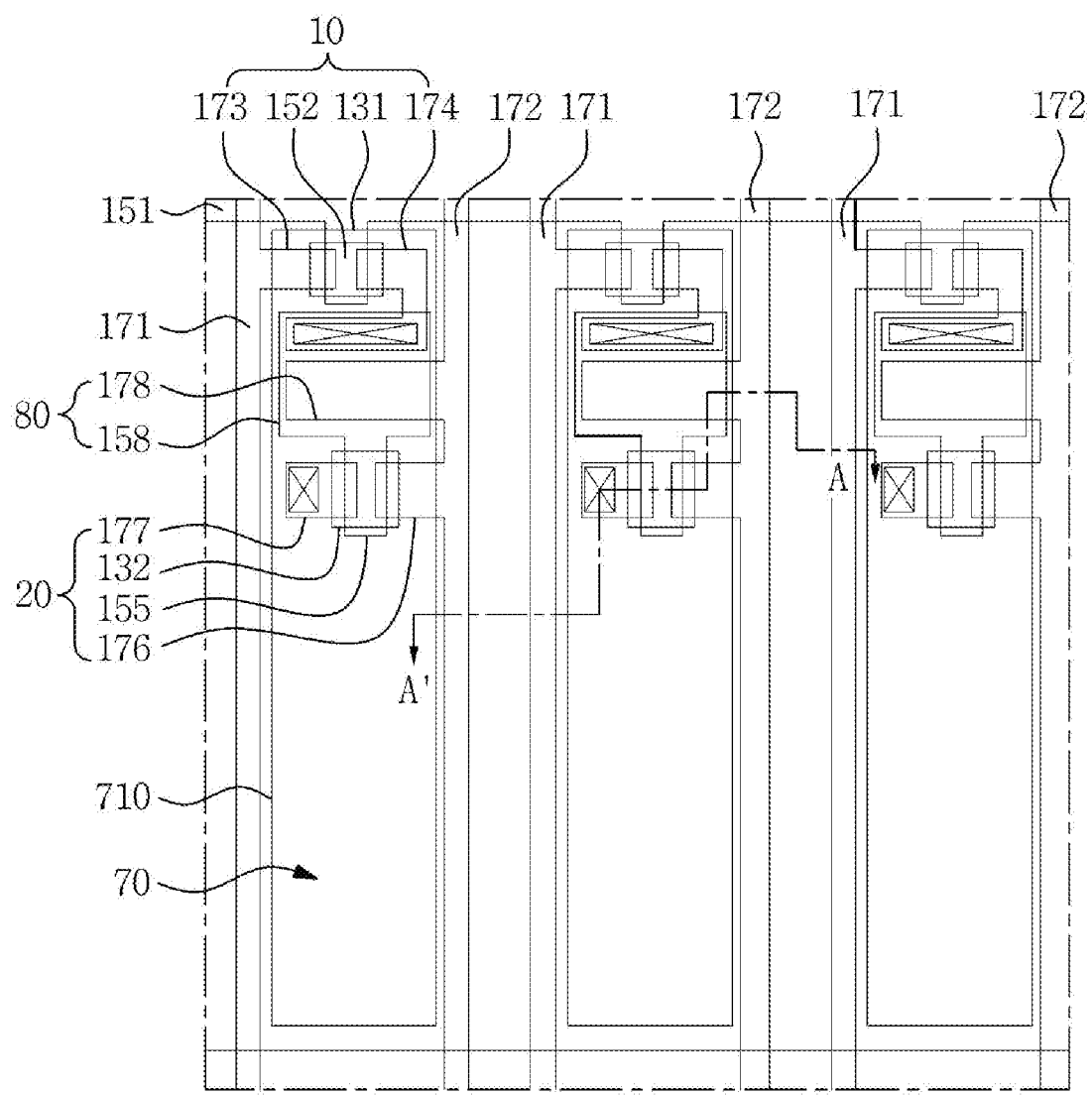
FIG. 3 is a plan view schematically illustrating one pixel of the display device of FIG. 1 according to an exemplary embodiment of the inventive concept.
Figure 4:
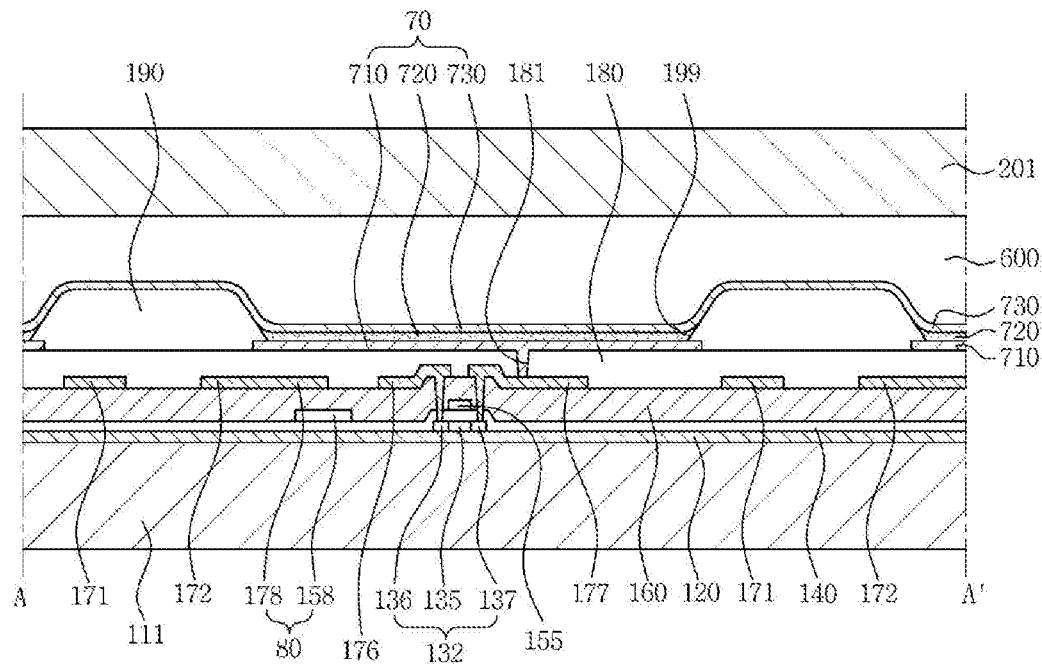
FIG. 4 is a cross-sectional view taken along line A-A' of FIG. 3 according to an exemplary embodiment of the inventive concept.

FIG. 3 is a plan view schematically illustrating one pixel of the display device of FIG. 1 according to an exemplary embodiment of the inventive concept, and FIG. 4 is a cross-sectional view taken along line A-A' of FIG. 3 according to an exemplary embodiment of the inventive concept.

An active matrix-type OLED (AMOLED) display device having a 2Tr-1Cap structure which includes two TFTs 10 and 20, and one capacitor 80 in each pixel in the display area (DA in FIG. 1) is illustrated in FIGS. 3 and 4, but the inventive concept is not limited thereto.

Accordingly, the OLED display device 100 may include three or more TFTs and two or more capacitors in each pixel, and may have various structures including additional lines. As used herein, the term "pixel" refers to the smallest unit for displaying an image, and the display area displays an image using a plurality of pixels.

The OLED display device 100 according to an exemplary embodiment of the inventive concept includes the first substrate 111 and the plurality of pixels defined in the first substrate 111. The OLED display device 100 further includes a switching TFT 10, a driving TFT 20, the capacitor 80, and an OLED 70 formed at each of the plurality of pixels. In addition, the first substrate 111 includes a gate line 151 arranged along one direction, and a data line 171 and a common power line 172 insulated from and intersecting the gate line 151.

In the present exemplary embodiment, each pixel may be defined by the gate line 151, the data line 171, and the common power line 172, which serve as a boundary, but the inventive concept is not limited thereto.

The OLED 70 may include a first electrode 710, an organic light emitting layer 720 formed on the first electrode 710, and a second electrode 730 formed on the organic light emitting layer 720. In the present exemplary embodiment, one or more first electrodes 710 are formed in each pixel, and thus the first substrate 111 includes a plurality of first electrodes 710 spaced apart from one another.

In the present exemplary embodiment, the first electrode 170 is an anode serving as a hole injecting electrode, and the second electrode 730 is a cathode serving as an electron injecting electrode. However, the inventive concept is not limited thereto, and thus the first electrode 710 may function as an anode, and the second electrode 730 may function as a cathode according to a driving method of the OLED display device. In addition, the first electrode 710 is a pixel electrode, and the second electrode 730 is a common electrode.

A hole and an electron injected into the organic light emitting layer 720 are combined with each other to form an exciton, and the OLED emits light by energy generated when the exciton falls from an excited state to a ground state.

The capacitor 80 may include a pair of storage electrodes 158 and 178 with an insulating layer 160 interposed therebetween. In the present exemplary embodiment, the insulating layer 160 may be a dielectric material. A capacitance of the capacitor 80 may be determined by electric charges stored in the capacitor 80 and a voltage across the pair of storage electrodes 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 may serve as a switching element which selects a pixel to perform light emission. The switching gate electrode 152 is connected to the gate line 151, and the switching source electrode 173 is connected to the data line 171. The switching drain electrode 174 is spaced apart from the switching source electrode 173 and is connected to a first storage electrode 158.

The driving TFT 20 applies, to the first electrode 710, a driving power that allows the organic light emitting layer 720 of the OLED 70 in a selected pixel to emit light. The driving gate electrode 155 is connected to the first storage electrode 158 connected to the switching drain electrode 174. The driving source electrode 176 and the second storage electrode 178 are connected to the common power line 172.

The driving drain electrode 177 is connected to the first electrode 710 of the OLED 70 through a drain contact hole 181.

With the above-described structure, the switching TFT 10 is operated by a gate voltage applied to the gate line 151 and serves to transmit a data voltage applied to the data line 171 to the driving TFT 20.

A voltage equivalent to a difference between a common voltage applied from the common power line 172 to the driving TFT 20 and the data voltage transmitted from the switching TFT 10 is stored in the capacitor 80, and current corresponding to the voltage stored in the capacitor 80 may flow to the OLED 70 through the driving TFT 20, such that the OLED 70 may emit light.

A structure of the OLED display device 100 according to an exemplary embodiment of the inventive concept will be described in more detail with reference to FIGS. 3 and 4.

The OLED 70, the driving TFT 20, the capacitor 80, the data line 171, and the common power line 172 illustrated in FIG. 3 will be mainly described. In the present exemplary embodiment, the switching semiconductor layer 131, the switching gate electrode 152, and the switching source and drain electrodes 173 and 174 of the switching TFT 10 may have the same laminated structure as that of the driving semiconductor layer 132, the driving gate electrode 155, and the driving source and drain electrodes 176 and 177 of the driving TFT 20, and thus a repeat description will not be provided.

A buffer layer 120 is formed on the first substrate 111. The buffer layer 120 may include at least one of the following: silicon nitride ($SiN_x$), silicon oxide ($SiO_2$), and silicon oxynitride ($SiO_xN_y$). However, the buffer layer 120 may not be always necessary and may be omitted according to the kind of the first substrate 111 and process conditions thereof.

The driving semiconductor layer 132 is disposed on the buffer layer 120. The driving semiconductor layer 132 may include a semiconductor material including, for example, at least one selected from the group consisting of polycrystalline silicon, amorphous silicon, and oxide semiconductors. In addition, the driving semiconductor layer 132 may include a channel region 135 that is not doped with impurities and p+ doped source and drain regions 136 and 137 that are formed on opposite sides of the channel region 135.

A gate insulating layer 140 which includes silicon nitride or silicon oxide is disposed on the driving semiconductor layer 132. The gate insulating layer 140 may include at least one selected from the group consisting of: tetraethyl orthosilicate (TEOS), silicon nitride (SiNx), and silicon oxide ($SiO_2$).

The driving gate electrode 155, the gate line (151 in FIG. 3), and the first storage electrode 158 are formed on the gate insulating layer 140. In the present exemplary embodiment, the driving gate electrode 155 is formed to overlap at least part of the semiconductor layer 132, e.g., to overlap the channel region 135.

The gate electrode 155 and the first storage electrode 158 are disposed on substantially the same layer, and include substantially the same metal material. In the present exemplary embodiment, the metal material may include at least one selected from the group consisting of: molybdenum (Mo), chromium (Cr), and tungsten (W). For example, the gate electrode 155 and the first storage electrode 158 may include molybdenum (Mo) or molybdenum alloys.

The insulating layer 160 configured to cover the driving gate electrode 155 is disposed on the gate insulating layer 140. The insulating layer 160 may be an insulating interlayer. The insulating layer 160 may include silicon nitride or silicon oxide, similar to the gate insulating layer 140. The gate insulating layer 140 and the insulating layer 160 have a contact hole to expose the source and drain regions 136 and 137 of the driving semiconductor layer 132.

The driving source electrode 176, the driving drain electrode 177, the data line 171, the common power line 172, and the second storage electrode 178 are formed on the insulating layer 160 in the display area DA. The driving source electrode 176 and the driving drain electrode 177 are respectively connected to the source and drain regions 136 and 137 of the driving semiconductor layer 132 through a contact hole.

In more detail, the driving source electrode 176, the driving drain electrode 177, the data line 171, the common power line 172, and the second storage electrode 178 may include a refractory metal which includes, for example, at least one selected from the group consisting of molybdenum, chromium, tantalum, and titanium, or metal alloys thereof, and may have a multi-layer structure including the refractory metal and a low-resistance conductive film.

The driving source electrode 176, the driving drain electrode 177, the data line 171, the common power line 172, and the second storage electrode 178 may include various conductive materials other than the above-described materials.

Accordingly, the driving TFT 20 is formed, including the driving semiconductor layer 132, the driving gate electrode 155, the driving source electrode 176, and the driving drain electrode 177. However, configuration of the driving TFT 20 is not limited thereto and may be modified into various structures.

A protective film 180 configured to cover, for example, the driving source electrode 176 and the driving drain electrode 177, is disposed on the insulating layer 160. The protective film 180 may include organic materials, such as polyacrylates and polyimides. The protective film 180 may be a planarization layer.

The protective film 180 may include at least one selected from the group consisting of: polyacrylate resins, epoxy resins, phenolic resins, polyamide resins, polyimide reins, unsaturated polyester resins, poly-phenylenether resins, poly-phenylenesulfide resins, and benzocyclobutene (BCB).

The protective film 180 includes the drain contact hole 181 which exposes the driving drain electrode 177.

The first electrode 710 is formed on the protective film 180 and the first electrode 710 is connected to the driving drain electrode 177 through the drain contact hole 181 of the protective film 180.

A pixel defining layer 190 is formed on the protective film 180 and covers part of the first electrode 710. The pixel defining layer 190 has an opening 199 which exposes the first electrode 710. In other words, the pixel defining layer 190 is disposed, at opposite end portions of the first electrode 710, in a form that covers part of the end portions of the first electrode 710. As such, as the pixel defining layer 190 is disposed at opposite end portions of the first electrode 710, the opening 199 is located between two pixel defining layers 190.

The first electrode 710 is disposed corresponding to the opening 199 of the pixel defining layer 190. The pixel defining layer 190 may include a resin, e.g., a polyacrylate resin or a polyimide resin.

In addition, the pixel defining layer 190 may include a photosensitive organic material or a photosensitive polymer material. For example, the pixel defining layer 190 may include one of polyacrylates, polyimides, photo sensitive polyimides (PSPI), photosensitive acryls (PA), and photosensitive Novolak resins.

The organic light emitting layer 720 is formed on the first electrode 710 in the opening 199, and the second electrode 730 is formed on the pixel defining layer 190 and the organic light emitting layer 720. In other words, the second electrode 730 is formed to cover the organic light emitting layer 720 and the two pixel defining layers 190.

As such, the OLED 70 including the first electrode 710, the organic light emitting layer 720, and the second electrode 730 is formed.

One of the first and second electrodes 710 and 730 may include a transparent conductive material and the other thereof may include a transflective or reflective conductive material. Depending on the material forming the first and second electrodes 710 and 730, the OLED display device 100 may implement a top-emission type, a bottom-emission type, or a double-side-emission type.

For example, in a case where the OLED display device 100 according to an exemplary embodiment of the inventive concept is a top-emission type, the first electrode 710 includes a transflective or reflective conductive material, and the second electrode 730 includes a transparent conductive material.

For the transparent conductive material, at least one selected from the group consisting of indium tin oxides (ITO), indium zinc oxides (IZO), zinc oxides (ZnO), and indium oxides ($In_2O_3$) may be used. For the reflective material, at least one selected from the group consisting of lithium (Li), calcium (Ca), lithium fluoride/calcium (LiF/Ca), lithium fluoride/aluminum (LiF/Al), aluminum (Al), silver (Ag), magnesium (Mg), and gold (Au) may be used.

The organic light emitting layer 720 may include a low molecular weight organic material or a high molecular weight organic material. The organic light emitting layer 720 may have a multi-layer structure that includes at least one of: a hole injection layer (HIL), a hole transporting layer (HTL), an electron transporting layer (ETL), and an electron injection layer (EIL). For example, the HIL may be disposed on the first electrode 710 which serves as the anode, and the HTL, ETL, and EIL may be sequentially laminated thereon.

According to an exemplary embodiment of the inventive concept, the organic light emitting layer 720 is formed only inside the opening 199 of the pixel defining layer 190, but the inventive concept is not limited thereto. Accordingly, at least one film of the organic light emitting layer 720 may not only be disposed on the first electrode 710 inside the opening 199 of the pixel defining layer 190, but also be disposed between the pixel defining layer 190 and the second electrode 730. In more detail, HIL, HTL, ETL, EIL, and the like of the organic light emitting layer 720 may be disposed, by an open mask, at a location other than the opening 199, and a light emitting layer of the organic light emitting layer 720 may be formed in each opening 199 by a fine metal mask (FMM).

In a case where the LCD display is used in an exemplary embodiment of the inventive concept, the first electrode 710 is physically and electrically connected to the driving drain electrode 177 through the drain contact hole 181 and receives the data voltage from the driving drain electrode 177. The first electrode 710 applied with the data voltage forms an electric field with the second electrode 730 (common electrode) applied with a common voltage, and the electric field determines an orientation of liquid crystal molecules of a liquid crystal layer between the two electrodes. The first electrode 710 and the second electrode 730 form a capacitor (hereinafter "a liquid crystal capacitor"), which maintains an applied voltage although the TFT is turned off.

The second substrate 201 is bonded to the first substrate 111 with the OLED 70 interposed therebetween. The second substrate 201 is configured to cover and protect the TFTs 10 and 20, the OLED 70, and the like dispose on the first substrate 111 to be sealed from the outside. In general, an insulating substrate including glass or plastic may be used as the second substrate 201. In the case of the top-emission type where an image is displayed toward the second substrate 201, the second substrate 201 includes a light-transmissive material.

In an exemplary embodiment of the inventive concept, a filling member 600 is disposed between the first substrate 111 and the second substrate 201. The filling member 600 is configured to protect inner components, e.g., the OLED 70, from external shock applied to the OLED display device 100. The filling member 600 may improve physical reliability of the OLED display device 100. The filling member 600 may include at least one of an organic sealant such as urethane resins, epoxy resins, or acrylic resins, or an inorganic sealant such as silicon. The urethane resins may include, for example, urethane acrylates. The acrylic resins may include, for example, butyl acrylates or ethyl hexyl acrylates.

Figure 5:
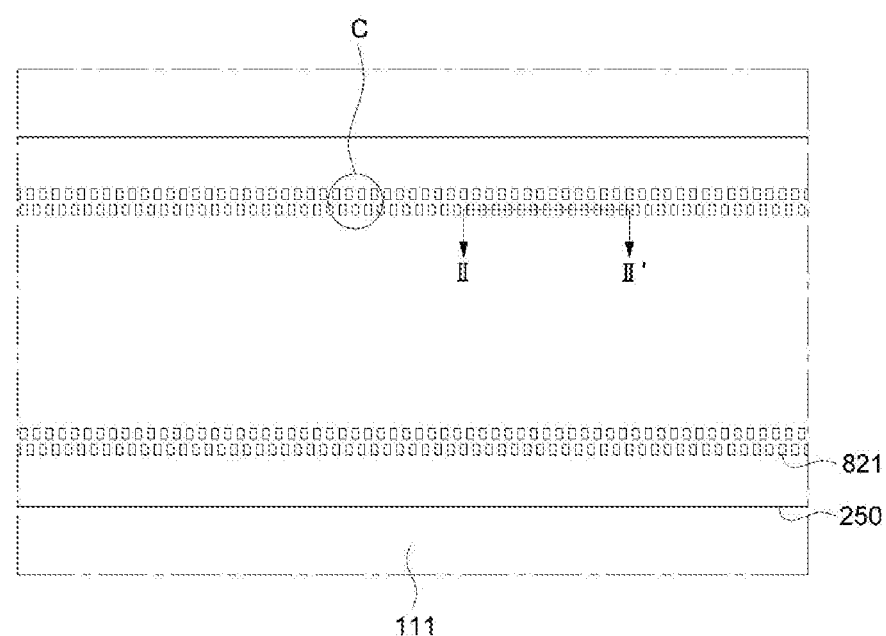
FIG. 5 is a plan view illustrating a portion B of FIG. 1 according to an exemplary embodiment of the inventive concept.
Figure 6:
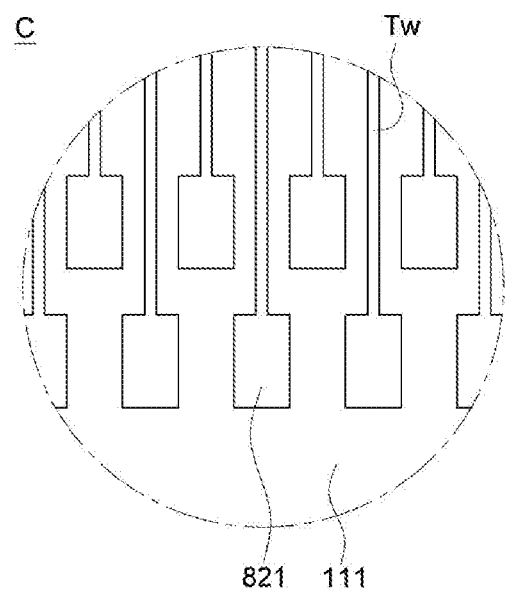
FIG. 6 is a plan view enlarging a portion C of FIG. 5 according to an exemplary embodiment of the inventive concept.
Figure 7:
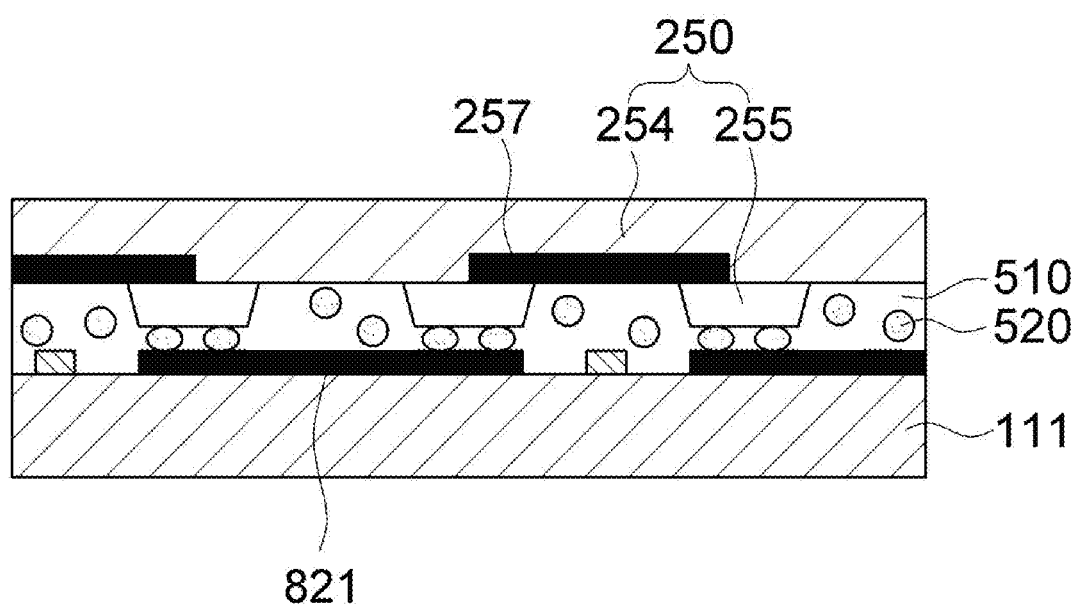
FIG. 7 is a cross-sectional view taken along line II-II' of FIG. 5 according to an exemplary embodiment of the inventive concept.

FIG. 5 is a plan view illustrating a portion B of FIG. 1 according to an exemplary embodiment of the inventive concept, FIG. 6 is a plan view enlarging a portion C of FIG. 5 according to an exemplary embodiment of the inventive concept, and FIG. 7 is a cross-sectional view taken along line II-II' of FIG. 5 according to an exemplary embodiment of the inventive concept.

Referring to FIGS. 5 to 7, a pad terminal 821 is connected to a thin film wiring Tw extending from the display unit (150 in FIG. 2). For example, the thin film wiring Tw connects the pad terminal 821 with the switching source electrode 173, the switching drain electrode 174, the driving source electrode 176, and the driving drain electrode 177 of the display unit 150 illustrated in FIGS. 2 and 3. The pad terminal 821 is located corresponding to the driver IC 250, and is connected to the driver IC 250 by the adhesive portion 500. In the present exemplary embodiment, the adhesive portion 500 may be an anisotropic conductive film (ACF).

The pad terminal 821 includes a material substantially the same as a material included in the switching source electrode 173, the switching drain electrode 174, the driving source electrode 176, and the driving drain electrode 177 of the display unit 150 illustrated in FIGS. 2 and 3. In exemplary embodiments of the inventive concept, the material forming the pad terminal 821 is not limited particularly, as long as it is a material substantially the same as a material included in the source electrode and the drain electrode constituting the TFT.

In an exemplary embodiment of the inventive concept, the adhesive portion 500 may electrically connect the pad terminal 821 and a circuit member, and the circuit member may include the driver IC 250 and the FPCB. The circuit member will be described below with respect to the driver IC 250 by way of example.

The driver IC 250 includes a main body 254 and one or more bumps 255 protruding at regular or predetermined intervals from the main body 254, as illustrated in FIG. 7.

The main body 254 overlaps the second pad portion 800 in the pad area PA of the first substrate 111.

The one or more bumps 255 extend from the main body 254 and are connected to the pad terminal 821 of the second pad portion 800. The one or more bumps 255 are located between the main body 254 and the adhesive portion 500 to overlap the pad terminal 821. In other words, the pad terminal 821 of the second pad portion 800 overlaps two adjacent bumps of the bumps 255.

The driver IC 250 is connected to the pad terminal 821 to control light emission of the OLED 70. The driver IC 250 is connected to the pad terminal 821 by the adhesive portion 500 and transmits a signal to the switching source electrode 173 and the driving source electrode 176 to cause light emission in the organic light emitting layer 720. The bump 255 of the driver IC 250 is connected to the pad terminal 821 by conductive particles 520 of the adhesive portion 500.

In the exemplary embodiment of FIG. 7, the adhesive portion 500 includes the conductive particles 520, but the inventive concept is not limited thereto. As an example, the adhesive portion 500 may be implemented without including the conductive particles 520. For example, the adhesive portion 500 according to an exemplary embodiment of the inventive concept may bond the driver IC 250 and the first substrate 111 with each other by an ultrasonic bonding method using, for example, a non-conductive paste (NCP) or a non-conductive film (NCF) as an adhesive. In the present exemplary embodiment, as the adhesive becomes thicker, an adhesive shear strength increases. Further, as the applied pressure increases, the adhesive shear strength increases. In other words, the adhesive shear strength varies depending on the combination of materials to be bonded. For example, in the case of glass plate-glass plate, glass plate-plastic material, and glass plate-steel plate, the adhesive shear strength increases as an application time increases.

The main body 254 includes a scan driver and a data driver for driving the pixels. The bump 255 is formed on the main body 254 that overlaps the pad terminal 821.

The driver IC 250 may be mounted in the pad area PA of the first substrate 111 in a chip on glass (COG) manner so as to be electrically connected to the pad terminal 821. The driver IC 250 generates a scan signal and a data signal in response to the driving power and signals transmitted through the PCB 260. The scan signal and the data signal are applied to the gate line 151 and the data line 171 of the display area DA through pad electrodes.

In an exemplary embodiment of the inventive concept, the driver IC 250 is not necessarily formed in the non-display area NDA and may be omitted. In addition, the driver IC 250 may be mounted on an FPCB by a chip on film (COF) method. In other words, a tape carrier package (TCP) in which the driver IC 250 is mounted in the form of COF may be applied to the OLED display device 100.

Figure 8:
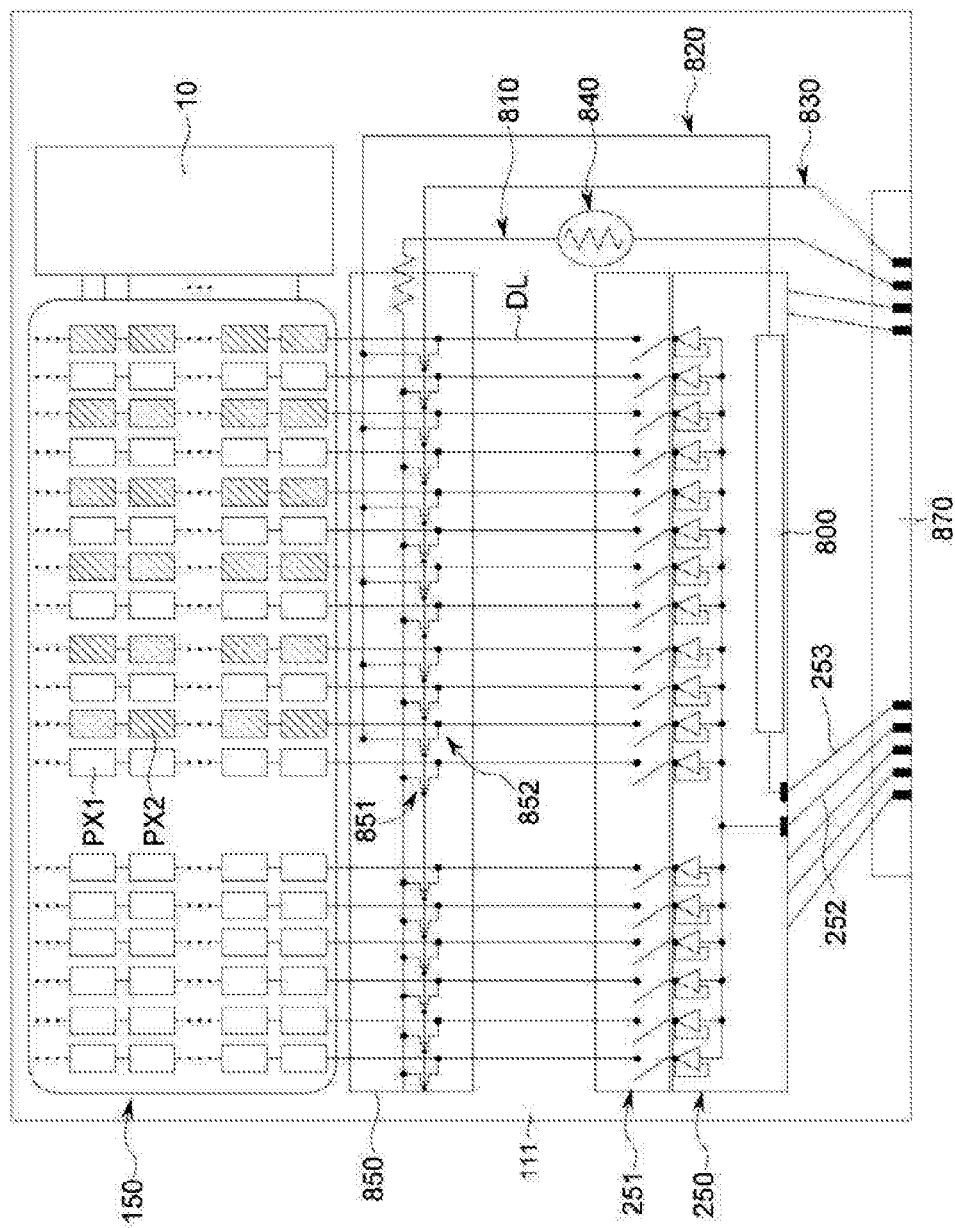
FIG. 8 is a configuration view schematically illustrating a display device according to an exemplary embodiment of the inventive concept.
Figure 9:
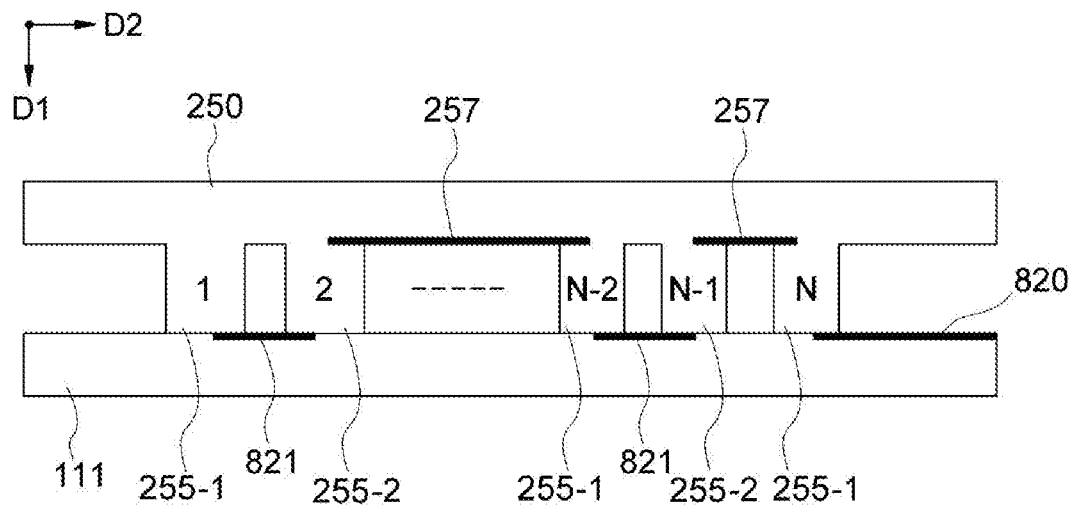
FIG. 9 is a cross-sectional view schematically illustrating a second pad portion of FIG. 8 according to an exemplary embodiment of the inventive concept.

FIG. 8 is a configuration view schematically illustrating a display device according to an exemplary embodiment of the inventive concept, and FIG. 9 is a cross-sectional view schematically illustrating a second pad portion of FIG. 8 according to an exemplary embodiment of the inventive concept.

Referring to FIGS. 1 to 9, the OLED display device 100 according to an exemplary embodiment of the inventive concept includes the first substrate 111, the display unit 150, the driver IC 250, a first TFT 851, a second TFT 852, a first wiring 810, a second wiring 820, a gate signal line 830, and the second pad portion 800.

As described with reference to FIG. 1, the first substrate 111 includes the display area DA and the non-display area NDA.

The display unit 150 includes a plurality of pixels PX1 and PX2 disposed in the display area DA. As illustrated in FIG. 4, one pixel PX1 or PX2 includes the first electrode 710, the organic light emitting layer 720, and the second electrode 730.

The driver IC 250 is located in the non-display area NDA and is electrically connected to the plurality of pixels PX1 and PX2 by a plurality of data lines DL.

A first pad portion 870 is formed on the non-display area NDA of the first substrate 111 and is electrically connected to the PCB 260. The first pad portion 870 is connected to the first wiring 810 and the gate signal line 830.

A first line 252 and a second line 253 are formed on the first substrate 111 to be connected to the first pad portion 870 and electrically connected to the driver IC 250.

A driving TFT 850 includes the first TFT 851 and the second TFT 852. The first TFT 851 and the second TFT 852 are alternately disposed.

A first terminal, e.g., a drain, of the first TFT 851 is connected to one of the plurality of data lines DL and adjusts a first data signal applied from the driver IC 250. A first terminal, e.g., a drain, of the second TFT 852 is connected to another of the plurality of data lines DL and adjusts the first data signal applied from the driver IC 250. In the present exemplary embodiment, the first data signal may include, for example, a white data power.

As described with reference to FIG. 1, the driver IC 250 is attached onto the first substrate 111 by the adhesive portion 500 interposed between the first substrate 111 and the driver IC 250.

The second pad portion 800 is disposed in the non-display area NDA and is electrically connected to the driver IC 250. The second pad portion 800 includes one or more pad terminals 821, as illustrated in FIG. 9. The one or more pad terminals 821 connect end portions of two adjacent bumps 255-1 and 255-2 of the one or more bumps 255.

The pad terminal 821 is interposed between the adhesive portion 500 and the first substrate 111 to overlap the driver IC 250. The pad terminal 821 is disposed in the pad area PA of the first substrate 111 to overlap the one or more bumps 255.

The one or more bumps 255 protrude from the driver IC 250 in a direction D1 substantially perpendicular to a length direction D2 of the driver IC 250 and are formed at regular intervals. In other words, in FIG. 9, the one or more bumps 255 extend from the driver IC 250 in the first direction D1 and are formed at predetermined intervals in the second direction D2. In the present exemplary embodiment, the one or more bumps 255 include a conductive material such as metal.

The one or more pad terminal 821 connects an end portion of an odd-numbered bump 255-1 of the one or more bumps 255 to an end portion of an even-numbered bump 255-2 of the one or more bumps 255, or connects an end portion of the even-numbered bump 255-2 of the one or more bumps 255 to an end portion of the odd-numbered bump 255-1 of the one or more bumps 255.

In the driver IC 250, one or more internal wirings 257 may be disposed at locations that oppose the one or more pad terminal 821 internally, e.g., as shown in FIGS. 7 and 9.

The one or more internal wirings 257 connects an end portion of the even-numbered bump 255-2 of the one or more bumps 255 to an end portion of the odd-numbered bump 255-1 of the one or more bumps 255, or connects an end portion of the odd-numbered bump 255-1 of the one or more bumps 255 to an end portion of the even-numbered bump 255-2 of the one or more bumps 255, so as not to overlap the one or more pad terminals 821.

In the second pad portion 800, one of the odd-numbered bumps 255-1 (e.g., 1) receives a second data signal from the driver IC 250 and transmits it to one of the even-numbered bump 255-2 (e.g. 2) through the pad terminal 821.

In the second pad portion 800, the second wiring 820 may be connected, toward an output, to a last one of the odd-numbered bumps 255-1 and the even-numbered bump 255-2 that are alternately arranged.

Referring again to FIG. 8, the first wiring 810 is located in the non-display area NDA to connect a source of the first TFT 851 to the first pad portion 870. The first wiring 810 includes a matching resistor 840. The matching resistor 840 has a resistance value substantially the same as a resistance value of the second pad portion 800. In other words, the resistance value of the matching resistor 840 is substantially equal to a sum of a resistance value of the pad terminal 821 of the second pad portion 800 and a resistance value of the internal wiring 257 in the driver IC 250.

The second wiring 820 is located in the non-display area NDA and connects a source of the second TFT 852 and the second pad portion 800.

The gate signal line 830 is connected to gate terminals of the first TFT 851 and the second TFT 852.

In FIG. 8, the driver IC 250 includes a switching unit 251 for switching the first data (white) signal and transmitting the first data signal to the first TFT 851 and the second TFT 852 through one of the data lines DL. In the present exemplary embodiment, the switching unit 251 may be implemented as a multiplexer (MUX) or a demultiplexer (DeMUX).

The second pad portion 800 may be disposed at one of opposite ends of the driver IC 250 or may be disposed at each of the opposite ends.

The first TFT 851 operates by a gate driving signal applied through the gate signal line 830. The first TFT 851 receives the first data signal from the driver IC 250 and receives the second data signal from the first wiring 810 through the matching resistor 840 to output a difference signal to at least one pixel PX1. In the present exemplary embodiment, the first data signal is a white data power, and the second data signal is a black data power. Alternatively, the first data signal may be a black data power and the second data signal may be a white data power.

The first TFT 851 outputs, to one or more pixels PX1, a power corresponding to a medium gray brightness of a specific color according to the difference signal. In other words, when the crimp resistance of the driver IC 250 is normal, the first TFT 851 outputs a power, corresponding to the medium gray brightness of the specific color according to the difference signal, to one or more pixels PX1. Accordingly, the first pixel PX1 is turned on with the medium gray brightness of the specific color.

In the second pad portion 800, the second data signal is output to the second TFT 852 through the first wiring 810 via one or more pad terminals 821 and one or more bumps 255-1 and 255-2.

The second TFT 852 receives the first data signal from the driver IC 250 and receives the second data signal from the second pad portion 800 to output a difference signal to one or more pixels PX2.

The second TFT 852 outputs, to one or more pixels PX2, a power corresponding to the medium gray brightness of a specific color according to the difference signal, or a power corresponding to a high gray brightness of the specific color according to the difference signal.

In other words, when the crimp resistance of the driver IC 250 is normal, the second TFT 852 outputs, to the second pixel PX2, a difference signal that is substantially the same as the difference signal output from the first TFT 851 to the pixel PX1, and the pixel PX2 displays a gray brightness substantially the same as a gray brightness of the pixel PX1.

In addition, when the second TFT 852 is in an open state or when the crimp resistance due to poor attachment of the driver IC 250 is higher than a predetermined reference, the second TFT 852 outputs, to the pixel PX2, a data signal higher than the signal output from the first TFT 851 to the pixel PX1, and the pixel PX2 is displayed brighter than the pixel PX1.

The first pad portion 870 is connected to the first line 252 that transmits the first data (white) signal to the driver IC 250, and to the second line 253 that transmits the second data (black) signal to the second pad portion 800.

The driver IC 250 may receive the first data signal or the second data signal from the PCB 260 through the first pad portion 870, and transmit it to the first TFT 851, the second TFT 852, and the second pad portion 800.

In addition, the driver IC 250 may not receive the first data signal or the second data signal from the PCB 260 through the first pad portion 870, and may apply the first data signal or the second data signal to the first TFT 851, the second TFT 852, and the second pad portion 800 by itself.

In an exemplary embodiment of the inventive concept, the adhesive portion 500 connects the driver IC 250 to the pad terminal 821 to mount the driver IC 250 on the first substrate 111. The adhesive portion 500 is disposed between the pad terminal 821 and the bumps 255-1 and 255-2 to electrically connect the pad terminal 821 and the bumps 255-1 and 255-2.

As illustrated in FIG. 7, the adhesive portion 500 is interposed between the pad terminal 821 and the bump 255 to electrically connect the pad terminal 821 and the bump 255.

Figure 10:
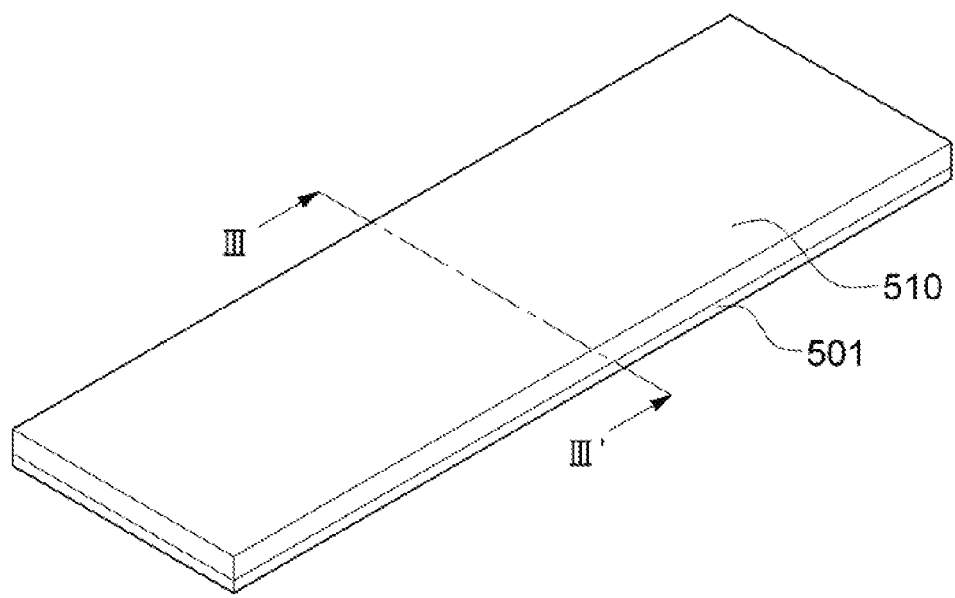
FIG. 10 is a perspective view schematically illustrating an adhesive portion according to an exemplary embodiment of the inventive concept.
Figure 11:
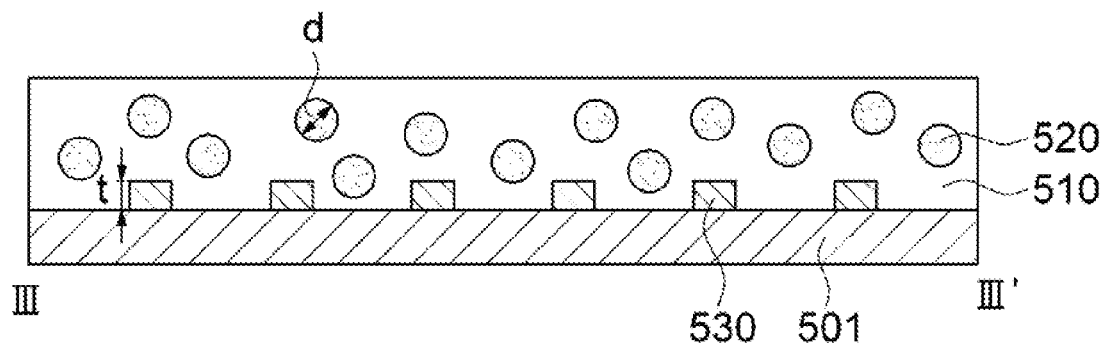
FIG. 11 is a cross-sectional view taken along line III-III' of FIG. 10 according to an exemplary embodiment of the inventive concept.

The adhesive portion 500 includes a base film 501, an adhesive layer 510, the conductive particles 520, and a first guide pattern 530, as illustrated in FIGS. 10 and 11.

FIG. 10 is a perspective view schematically illustrating an adhesive portion according to an exemplary embodiment of the inventive concept. and FIG. 11 is a cross-sectional view taken along line III-III' of FIG. 10 according to an exemplary embodiment of the inventive concept.

Referring to FIGS. 10 and 11, the base film 501 is attached to the adhesive layer 510 and includes a material having flexibility. The base film 501 may be separated from the adhesive layer 510 when the driver IC 250 is mounted on the first substrate 111. In more detail, the driver IC 250 may be mounted onto the first substrate 111 by attaching the driver IC 250 to one surface of the adhesive layer 510, exposed to the outside, that does not include the base film 501 attached thereto, separating the base film 501 from the adhesive layer 510, and attaching, to the first substrate 111, another surface of the adhesive layer 510 which is exposed to the outside and from which the base film 501 is separated.

The adhesive layer 510 is located on the base film 501. The adhesive layer 510 includes a resin, and when the driver IC 250 is mounted onto the first substrate 111, the first substrate 111 and the driver IC 250 are attached to opposite surfaces of the adhesive layer 510. The adhesive layer 510 may be melted or hardened according to a bonding method. For example, the adhesive layer 510 may be melted by heat or hardened by ultraviolet rays. In other words, the melting and hardening properties of the adhesive layer 510 may be controlled by different bonding methods, and the driver IC 250 may be mounted onto the first substrate 111 by adjusting the melting and hardening properties of the adhesive layer 510.

The adhesive layer 510 is located between the driver IC 250 and the first substrate 111, and serves to attach the driver IC 250 to the first substrate 111. The plurality of conductive particles 520 are located in the adhesive layer 510, and the adhesive layer 510 prevents a short circuit between neighboring conductive particles 520.

At least one of the conductive particles 520 is dispersed in the adhesive layer 510, and conductive particles, of the plurality of conductive particles 520, that are located between the bump 255 and the pad terminal 821 directly connect the bump 255 and the pad terminal 821.

The first guide pattern 530 is disposed on one surface of the adhesive layer 510 that is adjacent to the pad terminal 821. The first guide pattern 530 includes a material substantially the same as a material included in the adhesive layer 510, and the first guide pattern 530 is formed by curing part of the adhesive layer 510. Accordingly, the first guide pattern 530 is disposed inside the adhesive layer 510, and a hardness of the first guide pattern 530 is greater than a hardness of the adhesive layer 510. The first guide pattern 530 may be a linear pattern.

In addition, the first guide pattern 530 is disposed alternately with the pad terminal 821 and the bump 255 to control the flowability of the conductive particles 520. As the first guide pattern 530 is disposed between the pad terminal 821 and the bump 255, the probability that the conductive particles 520 are located between the pad terminal 821 and the bump 255 increases. In other words, the first guide pattern 530 serves to push the conductive particles 520 located between the pad terminals 821 upward above the pad terminal 821. The first guide pattern 530 may electrically connect the pad terminal 821 and the bump 255 with only a small number of conductive particles 520, and may lower the probability of a short circuit that may be generated due to the conductive particles 520.

In the exemplary embodiment of FIG. 11, the adhesive portion 500 is described as including the conductive particles 520, but the inventive concept is not limited thereto, and the adhesive portion 500 may not include the conductive particles 520. For example, the adhesive portion 500 according to an exemplary embodiment of the inventive concept may bond the driver IC 250 and the first substrate 111 by an ultrasonic bonding method using a non-conductive paste (NCP) and a non-conductive film (NCF) as an adhesive.

In an exemplary embodiment of the inventive concept, the OLED display device 100 may further include a driving unit configured to output a signal to the driver IC 250, a first wiring, and a gate signal line.

Figure 13:
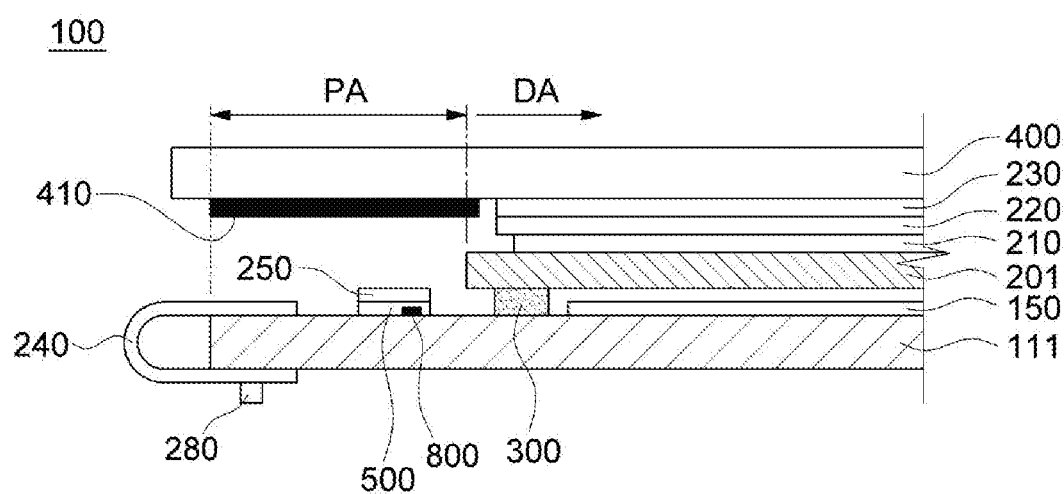
FIG. 13 is a view illustrating a second PCB mounted on a connection portion according to an exemplary embodiment of the inventive concept.

The driving unit may be the PCB 260 illustrated in FIG. 2 or a second PCB 280 mounted on the connection portion 240, e.g., the FPCB, as illustrated in FIG. 13.

The PCB 260 is connected to, for example, the first wiring 810, the gate signal line 830, the first line 252, and the second line 253 through the connection portion 240.

Figure 12:
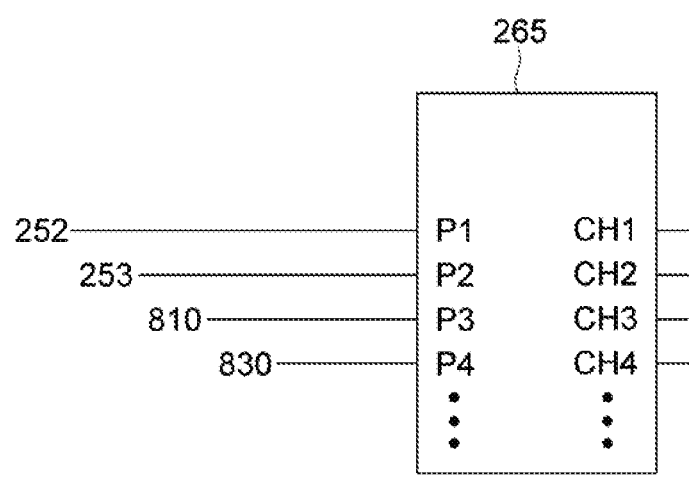
FIG. 12 is a view illustrating an internal configuration of a printed circuit board (PCB) according to an exemplary embodiment of the inventive concept.

The second PCB 280 illustrated in FIG. 13 is in the form of an IC chip and includes a driver chip 265 as illustrated in FIG. 12.

FIG. 12 is a view illustrating an internal configuration of a printed circuit board (PCB) according to an exemplary embodiment of the inventive concept, and FIG. 13 is a view illustrating a second PCB mounted on a connection portion according to an exemplary embodiment of the inventive concept.

As illustrated in FIG. 12, the driver chip 265 includes a plurality of ports, e.g., a first port P1, a second port P2, a third port P3, and a fourth port P4.

The first port P1 is connected to the first line 252, the second port P2 is connected to the second line 253, the third port P3 is connected to the first wiring 810, and the fourth port P4 is connected to the gate signal line 830.

The driver chip 265 may be, for example, a microprocessor or an IC chip.

The driver chip 265 applies the first data signal to the driver IC 250 through the first line 252 which is connected to the first port P1, and applies the second data signal to the driver IC 250 through the second line 253 which is connected to the second port P2.

The driver chip 265 applies the second data signal to the first TFT 851 through the first wiring 810 which is connected to the third port P3, and applies the gate driving signal to gate terminals of the first TFT 851 and the second TFT 852 through the gate signal line 830.

Referring to FIG. 13, the second PCB 280 according to an exemplary embodiment of the inventive concept may be implemented as an IC chip that is mounted on the connection portion 240 in the form of an FPCB.

The second PCB 280 may be mounted on the connection portion 240 in a manner such as chip-on film (COF) or tape carrier package (TCP).

The second PCB 280 applies a driving signal to the display panel 200. To this end, the second PCB 280 may include, for example, a timing controller for generating a control signal for driving the display panel 200 and a power voltage generator for generating a power voltage.

The connection portion 240 is connected to the pad area PA of the display panel 200. The connection portion 240 may be electrically connected to the display panel 200 and the PCB 260 to provide an electrical connection relationship between the display panel 200 and the PCB 260. The connection portion 240 may be an FPCB. In addition, the connection portion 240 may be configured as a chip-on film (COF) or tape carrier package (TCP) provided with an IC chip.

As described above, according to exemplary embodiments of the inventive concept, a display device capable of identifying whether a driver IC is well attached to a substrate during a COG or COP process in the manufacturing process of the display device may be realized.

As set forth hereinabove, according to exemplary embodiments of the inventive concept, the crimp state of the driver IC may be easily identified based on changes in luminance of the pixel.

Accordingly, an inspection time may be shortened, and inspection for a completed module product may be performed, without damaging the product's appearance.

While the inventive concept has been shown and described with reference to the exemplary embodiments thereof, it will be apparent to those of ordinary skill in the art that various changes in form and details may be made thereto without departing from the spirit and scope of the inventive concept as set forth by the appended claims.

What is claimed is:

1. A display device, comprising:
   a first substrate including a display area and a non-display area;
   a plurality of pixels disposed in the display area;
   a driver integrated circuit located in the non-display area and electrically connected to the plurality of pixels through a plurality of data lines;
   a first pad portion disposed in the non-display area and electrically connected to a printed circuit hoard;
   a second pad portion disposed in the non-display area and electrically connected to the driver integrated circuit;
   a first wiring located in the non-display area and connected to the first pad portion;
   a second wiring located in the non-display area and connected to the second pad portion;
   a first thin film transistor electrically connecting one of the plurality of data lines to the driver integrated circuit and the first wiring;
   a second thin film transistor electrically connecting another of the plurality of data lines to the driver integrated circuit and the second wiring;
   a gate signal line connected to gate terminals of the first thin film transistor and the second thin film transistor; and
   a driving unit that supplies a first data signal to the driver integrated circuit and a second data signal to the second pad portion.

2. The display device of claim 1, wherein the first thin film transistor and the second thin film transistor are alternately disposed.

3. The display device of claim 1, wherein the first wiring comprises a matching resistor.

4. The display device of claim 3, wherein the matching resistor has a resistance value that is substantially equal to a resistance value of the second pad portion.

5. The display device of claim 1, further comprising an adhesive portion interposed between the first pad portion and the driver integrated circuit.

6. The display device of claim 5, wherein the adhesive portion comprises:
   an adhesive layer; and
   at least one conductive particle dispersed in the adhesive layer.

7. The display device of claim 1, wherein the driving unit is configured to output a signal to the first wiring and the gate signal lit.

8. The display device of claim 7, wherein the driving unit comprises a driver chip including:
   a first port;
   a second port;
   a third port connected to the first wiring; and
   a fourth port connected to the gate signal line.

9. The display device of claim 8, further comprising:
   a first line disposed on the first substrate and configured to transmit the first data signal output from the driver chip to the driver integrated circuit; and
   a second line disposed on the first substrate and configured to apply the second data signal output from the driver chip to the second pad portion.

10. The display device of claim 1, wherein the driver integrated circuit comprises:
    a switching unit configured to switch the first data signal and transmit the first data signal to the first thin film transistor and the second thin film transistor through one of the plurality of data lines.

11. The display device of claim 1, wherein the driver integrated circuit comprises:
    a main body overlapping the second pad portion in a pad area of the first substrate; and
    one or more bumps protruding from the main body at predetermined intervals.

12. The display device of claim 11, wherein the second pad portion comprises:
    one or more pad terminals that connect end portions of two adjacent bumps of the one or more bumps.

13. The display device of claim 12, wherein the second pad portion outputs the second data signal to the second thin film transistor through the second wiring via the one or more bumps.

14. The display device of claim 1, wherein the second pad portion is disposed at one of opposite ends of the driver integrated circuit or at each of the opposite ends of the driver integrated circuit.

15. The display device of claim 1, wherein the first thin film transistor is configured to receive the first data signal from the driver integrated circuit, receive the second data signal from the first wiring, and output a difference signal to one or more of the plurality of pixels.

16. The display device of claim 1, wherein the second thin film transistor is configured to receive the first data signal from the driver integrated circuit, receive the second data signal from the second pad portion, and output a difference signal to one or more of the plurality of pixels.

17. A display device, comprising:
- a first substrate including a display area and a non-display area;
- a plurality of pixels disposed in the display area;
- a driver integrated circuit located in the non-display area and electrically connected to the plurality of pixels through a plurality of data lines;
- a first pad portion disposed in the non-display area;
- a second pad portion disposed in the non-display area and electrically connected to the driver integrated circuit;
- a first wiring located in the non-display area and connected to the first pad portion;
- a second wiring located in the non-display area and connected to the second pad portion;
- a first thin film transistor electrically connecting one of the plurality of data lines to the driver integrated circuit and the first wiring;
- a second thin film transistor electrically connecting another of the plurality of data lines to the driver integrated circuit and the second wiring;
- a gate signal line connected to gate terminals of the first thin film transistor and the second thin film transistor;
- a connection portion electrically connected to the first pad portion; and
- a printed circuit board electrically connected to the connection portion, wherein the printed circuit board comprises:
- a driving unit configured to output a signal to the driver integrated circuit, the first wiring, and the gate signal line, wherein the driving unit comprises:
- a driver chip configured to output a first data signal to the driver integrated circuit and a second data signal through the first pad portion to the second pad portion.

18. The display device of claim 17, wherein the driver chip is configured to output a gate driving signal to the first pad portion.

19. A display device, comprising:
- a plurality of pixels including a plurality of first pixels and a plurality of second pixels alternately disposed in a first direction;
- a plurality of first transistors and a plurality of second transistors alternately disposed in the first direction, wherein the plurality of first transistors are connected to the plurality of first pixels and the plurality of second transistors are connected to the plurality of second pixels;
- a first pad portion connected to a printed circuit board;
- a second pad portion connected to a driver integrated circuit;
- a first wiring connecting the plurality of first transistors to the first pad portion via a matching resistor and;
- a second wiring connecting the plurality of second transistors to the second pad portion; and
- a driving unit that supplies a first data signal to the driver integrated circuit and a second data signal to the second pad portion, wherein the matching resistor has a resistance value that is substantially the same as a resistance value of the second pad portion.

\* \* \* \* \*